United States Patent
Park et al.

(10) Patent No.: US 8,119,431 B2
(45) Date of Patent: Feb. 21, 2012

(54) METHOD OF FORMING A MICRO-ELECTROMECHANICAL SYSTEM (MEMS) HAVING A GAP STOP

(75) Inventors: Woo Tae Park, Chandler, AZ (US); Lisa H. Karlin, Chandler, AZ (US); Lianjun Liu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/632,940

(22) Filed: Dec. 8, 2009

(65) Prior Publication Data

US 2011/0133294 A1 Jun. 9, 2011

(51) Int. Cl.
*H01L 21/00* (2006.01)
(52) U.S. Cl. ............... 438/50; 438/106; 438/455
(58) Field of Classification Search ............... 438/50
See application file for complete search history.

(56) References Cited

U.S. PATENT DOCUMENTS

| | | | |
|---|---|---|---|
| 5,668,033 A | 9/1997 | Ohara et al. | |
| 6,346,742 B1 | 2/2002 | Bryzek et al. | |
| 6,617,524 B2 | 9/2003 | Vo | |
| 6,841,453 B2 * | 1/2005 | Mastromatteo | 438/455 |
| 7,037,805 B2 * | 5/2006 | DCamp et al. | 438/455 |
| 7,138,293 B2 | 11/2006 | Ouellet et al. | |
| 7,736,949 B2 * | 6/2010 | Chen et al. | 438/106 |
| 7,846,815 B2 * | 12/2010 | Karlin et al. | 438/456 |
| 2006/0208326 A1 | 9/2006 | Nasiri et al. | |
| 2007/0048898 A1 * | 3/2007 | Carlson et al. | 438/106 |
| 2008/0048313 A1 * | 2/2008 | Sand | 257/704 |
| 2010/0065934 A1 * | 3/2010 | Eriksen et al. | 257/419 |

FOREIGN PATENT DOCUMENTS

EP 1720204 A1 11/2006
KR 10-2007-0093837 A 9/2007

OTHER PUBLICATIONS

U.S. Appl. No. 12/356,939, filed Jan. 21, 2009.
Jin, et al., "MEMS Vacuum Packaging Technology and Applications", IEEE, Electronic Packaging Technology, 5th International Conference, 2003, pp. 301-306.
PCT/US2010/057618, International Search Report and Written Opinion, dated Jul. 22, 2011.

* cited by examiner

*Primary Examiner* — Phuc Dang
(74) *Attorney, Agent, or Firm* — James L. Clingan, Jr.

(57) ABSTRACT

A method of forming a micro-electromechanical system (MEMS) includes providing a cap substrate, providing a support substrate, depositing a conductive material over the support substrate, patterning the conductive material to form a gap stop and a contact, wherein the gap stop is separated form the contact by an opening, forming a bonding material over the contact and in the opening, wherein the gap stop and the contact prevent the bonding material from extending outside the opening, and attaching the cap substrate to the support substrate by the step of forming the bonding material. In addition, the structure is described.

12 Claims, 7 Drawing Sheets

METHOD OF FORMING A MICRO-ELECTROMECHANICAL SYSTEM (MEMS) HAVING A GAP STOP

BACKGROUND

1. Field

This disclosure relates generally to micro electromechanical systems (MEMS), and more specifically, to MEMS that are intended to be connected to a capping device in close proximity.

2. Related Art

MEMS have become very important in providing certain functions such as accelerometers and gyroscopes in a very small space. There are many automotive applications where this is very useful from relatively simple applications such as air bags to very sophisticated guidance assist functions. In performing these functions, precision can be important. Generally the MEMS devices themselves have elements that move and this movement is detected through capacitive coupling. The predictability of this capacitive coupling is useful in providing precision to the function being performed. The capacitance coupling may not be just within the same MEMS layer but may include coupling to another layer which may be above or below the MEMS layer. In either case the other layer may be incorporated into a capping wafer. The MEMS wafer and the capping wafer work together in achieving the overall desired functionality. This working together may require both electrical connection by contact and capacitive coupling. Both are important and it is desirable for both to have all of the characteristics known to be important in manufacturing a product. This includes being reliable, manufacturable, low cost, and precise.

Accordingly there is a need to improve upon any of the issues raised above regarding MEMS.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect micro electromechanical systems (MEMS) include a contact that is for contacting a capping device. The contact has a center portion that includes a supporting portion above a top plane of the MEMS device with a bonding portion on it. The supporting portion is surrounded by a space stop also above the top plane of the MEMS device. Preferably the supporting portion and the space stop are the same height above the top plane. As one alternative, the space stop may be higher than the supporting portion. It is beneficial for the height of the space stop above the top plane be established by a deposition rather than an etch because an etch is more difficult to control. The space stop establishes a distance between the top plane and a subsequently attached capping device. By so doing the established distance is useful in controlling the amount of capacitance between a capacitor plate on the MEMS and a capacitor plate on the capping device.

The semiconductor substrate described herein can be any semiconductor material or combinations of materials, such as gallium arsenide, silicon germanium, silicon-on-insulator (SOI), polysilicon, monocrystalline silicon, the like, and combinations of the above.

Figure 1:
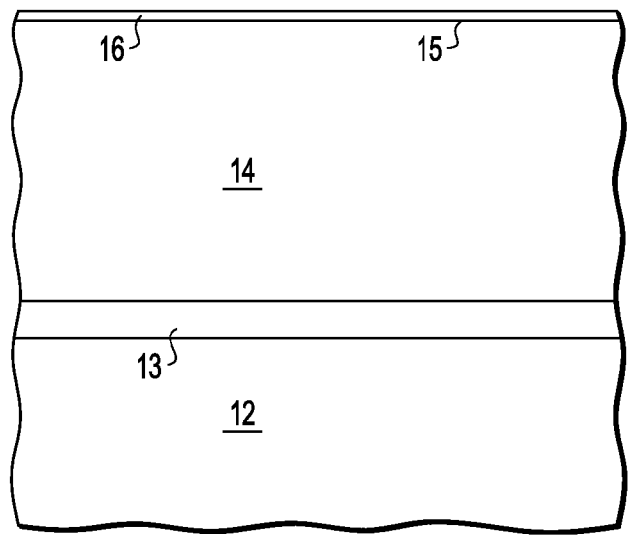
FIG. 1 is a cross section of a portion of a MEMS device at a stage in processing according to an embodiment.

Shown in FIG. 1 is a contact region 10 of a MEMS device comprising a substrate 12, an insulating layer 13 over substrate 12, an interconnect region 14 over insulating layer 13, and an insulating layer 16 over interconnect region 14. A top surface of interconnect region 14 may be considered a top plane 15 of the MEMS device. Insulating layer 16 may be of oxide and relatively thin, for example 1000 Angstroms. In this example interconnect region 14 may be about 25 microns thick. Insulating layer 13 may be oxide about one micron thick. Substrate 12 is preferably silicon, is for mechanical support, and may be called a handle wafer, or more particularly from a handle wafer.

Figure 2:
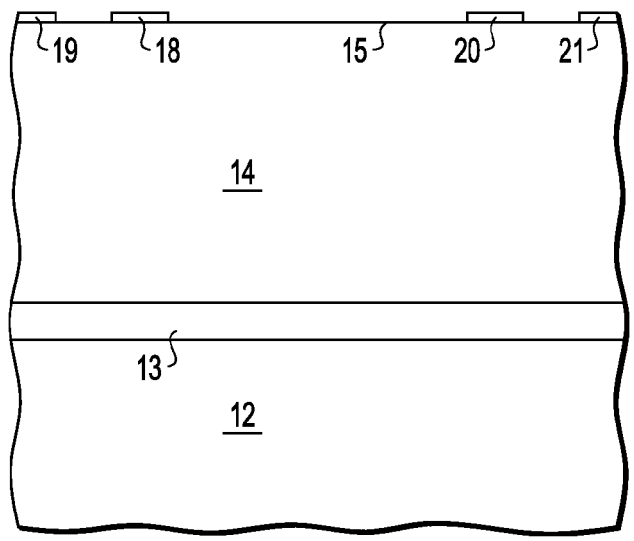
FIG. 2 is a cross section of the portion of the MEMS device of FIG. 1 at a subsequent stage in processing.

Shown in FIG. 2 is contact region 10 after insulating layer 16 has been selectively etched to leave etch stop regions 18, 19, 20, and 21. Etch stop regions 18 and 20 appear to be separate regions spaced apart but are one continuous region encircling the region as shown between etch stop regions 18 and 20. Outside of etch regions 18 and 20 are additional etch stop regions 19 and 21 left from the etch of insulating layer 16 which similarly are actually different cross sections of a continuous layer spaced from etch stop regions 18 and 20.

Figure 3:
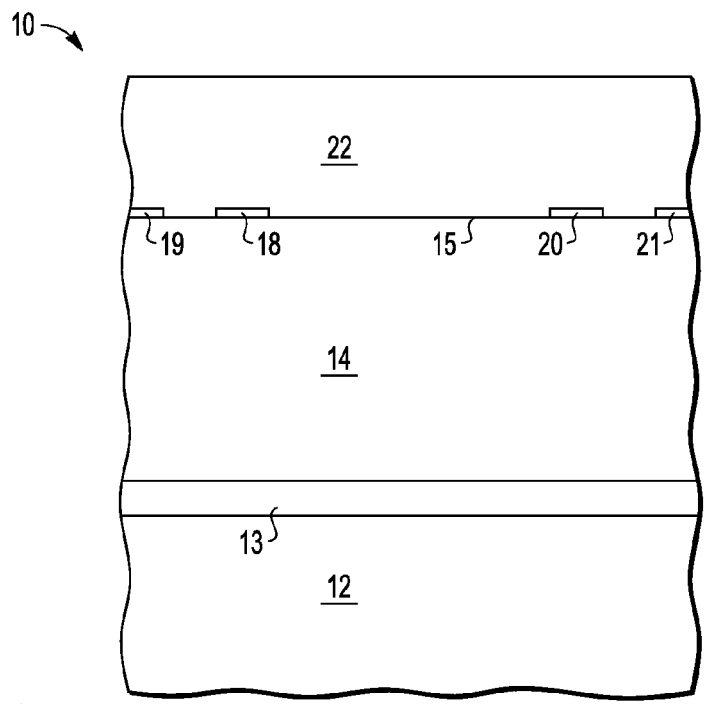
FIG. 3 is a cross section of the portion of the MEMS device of FIG. 2 at a subsequent stage in processing.

Shown in FIG. 3 is contact region 10 after depositing a conductive layer 22 over interconnect region 14 and etch stop regions 18, 19, 20, and 21 which is doped to be conductive. Polysilicon layer 22 may be about 5 microns thick. Conductive layer 22 may be polysilicon that is doped. The doping may be in situ or by implanting or even both.

Figure 4:
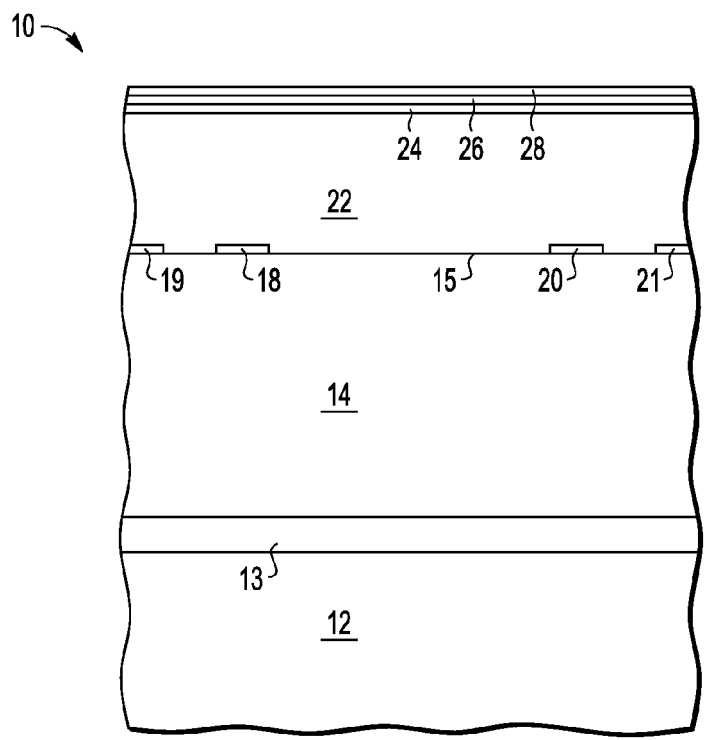
FIG. 4 is a cross section of the portion of the MEMS device of FIG. 3 at a subsequent stage in processing.

Shown in FIG. 4 is contact region 10 after forming a polysilicon layer 24 on polysilicon layer 22, a silicon germanium (SiGe) layer 26 on polysilicon layer 24, and a germanium layer 28 on SiGe layer 26. SiGe layer 24 may be graded beginning with a very low concentration of germanium and ending with a significant higher, even 100 percent, germanium concentration. Germanium layer 28 may be about a half of a micron thick. For simplicity, SiGe layer may be simply one concentration of Germanium, for example 50 percent by atomic weight. Polysilicon layer 24 is useful for being doped for optimizing the deposition of the subsequent layer, SiGe layer 24. SiGe layer 26 and germanium layer 28 are for use in making a contact by eutectic bonding. Germanium has sufficiently low temperature at which it will form a eutectic bond with aluminum to make it effective for the purpose of forming a contact in that manner. SiGe layer 26 provides a transition from contacting silicon at polysilicon layer 22 to the germanium at germanium layer 28.

Figure 5:
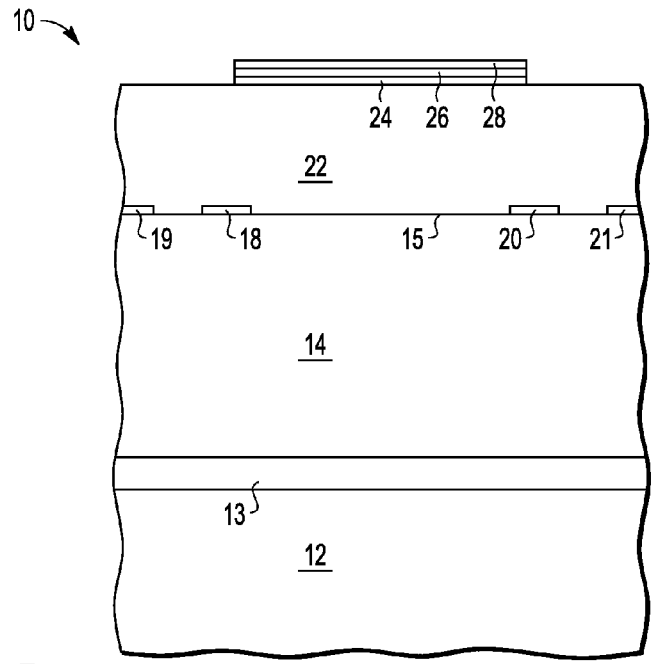
FIG. 5 is a cross section of the portion of the MEMS device of FIG. 4 at a subsequent stage in processing.

Shown in FIG. 5 is contact region 10 after removing a portion of SiGe layer 26 and germanium layer 28. The boundary of the remaining portion is aligned to etch stop regions 18 and 20. The primary purpose of this etch is that SiGe layer 26 and germanium layer 28 are removed from the areas immediately outside etch stop regions 18 and 20.

Figure 6:
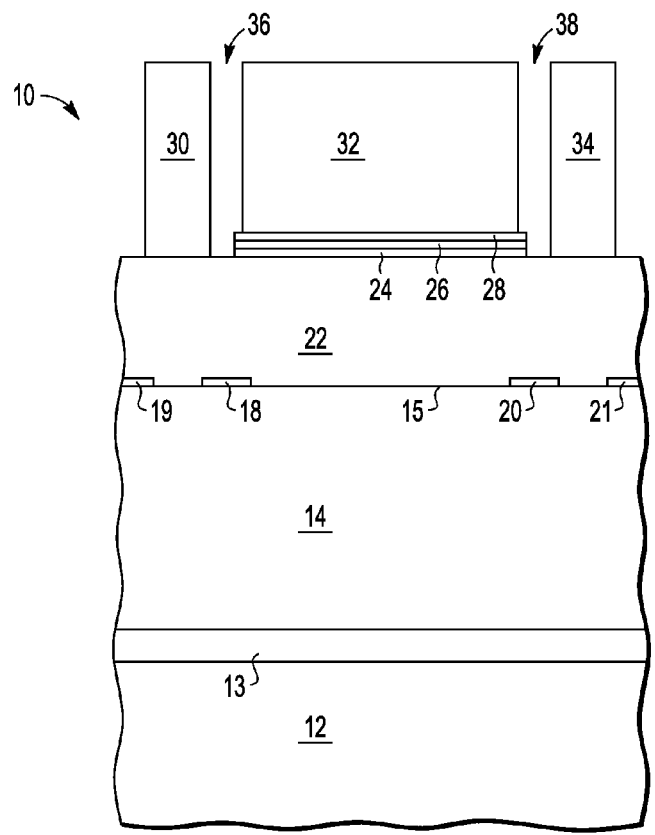
FIG. 6 is a cross section of the portion of the MEMS device of FIG. 5 at a subsequent stage in processing.

Shown in FIG. 6 is a contact region 10 after forming and patterning a photoresist layer to leave photoresist portions 30, 32, and 34. As shown, an opening 36 is formed between photoresist portions 30 and 32 and an opening 38 is formed between photoresist portions 32 and 34. In cross section openings 36 and 38 appear to be different openings, openings 36 and 38 are part of one continuous opening that surrounds photoresist portion 32. Photoresist portion 32 is nearly aligned to the inner edges of etch stop regions 18 and 20 but extends to being at least a small amount over etch stop regions 18 and 20. Similarly, photoresist portions 30 and 34 have an outer edge that extends to being at least a small amount over etch stop regions 19 and 21, respectively, and photoresist portions 30 and 34 have an inner edge that extends to being at least a small amount over etch stop regions 18 and 20, respectively.

Figure 7:
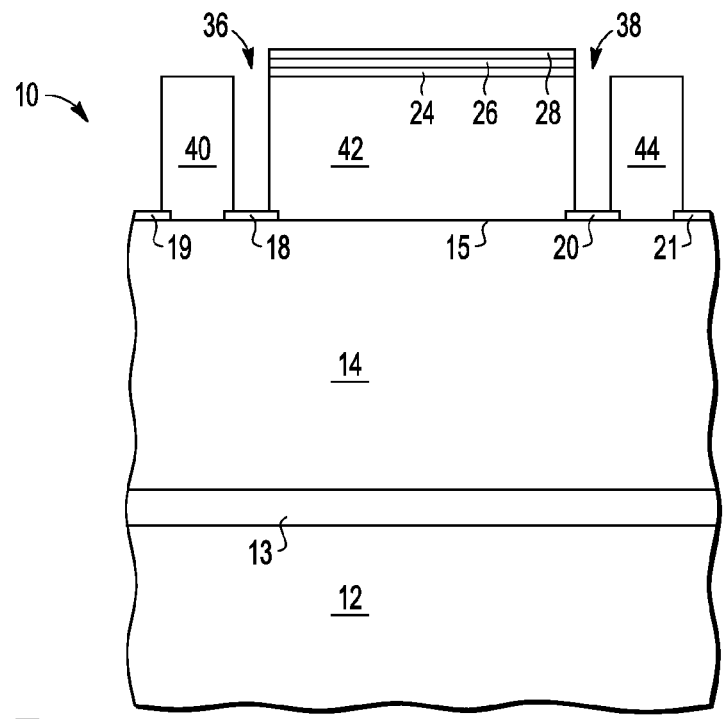
FIG. 7 is a cross section of the portion of the MEMS device of FIG. 6 at a subsequent stage in processing.

Shown in FIG. 7 is contact region 10 after performing an etch to extend openings 36 and 38 into conductive region 22 to leave conductive portions 40, 42, and 44. Etch stop regions 18, 19, 20, and 21 prevent the etch from extending into interconnect region 14. The etch composition does etch germanium and SiGe so that the small portion of SiGe and germanium exposed from outside photoresist portion 32 is etched. Conductive portions 40 and 42 appear to be different regions in cross section but actually extend around conductive portion 42. Thus there is a continuous ring, which may be polysilicon, around conductive portion 42. Conductive portions 40 and 42 are the same height above top plane 15. This height above plane 15 is established by the deposition of layer 22. This height is not subsequently effected in a meaningful way by an subsequent etch. The etch that removes SiGe layer 26 and geramanium layer 28 is selective to polysilicon. During the overetch, there is some minimal etching, likely to be enough to remove the 100 Angstroms of layer 24, but 100 Angstroms out a thickness of 5 microns is only about 0.2 percent.

Figure 8:
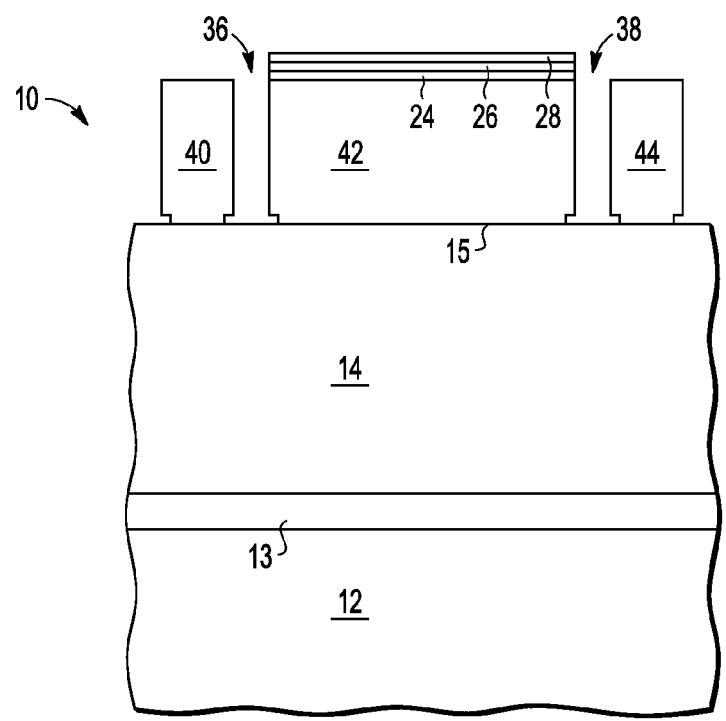
FIG. 8 is a cross section of the portion of the MEMS device of FIG. 7 at a subsequent stage in processing.

Shown in FIG. 8 is contact region 10 after etching away etch stop regions 18, 19, 20, and 21. This may be a wet etch or a vapor phase etch. There are likely to be other oxide etches during processing that of the MEMS that may be applied with conductive portions 40, 42, and 44 present so that removal of etch stop regions 18, 19, 20, and 21 may be removed incidental to achieving other purposes.

Figure 9:
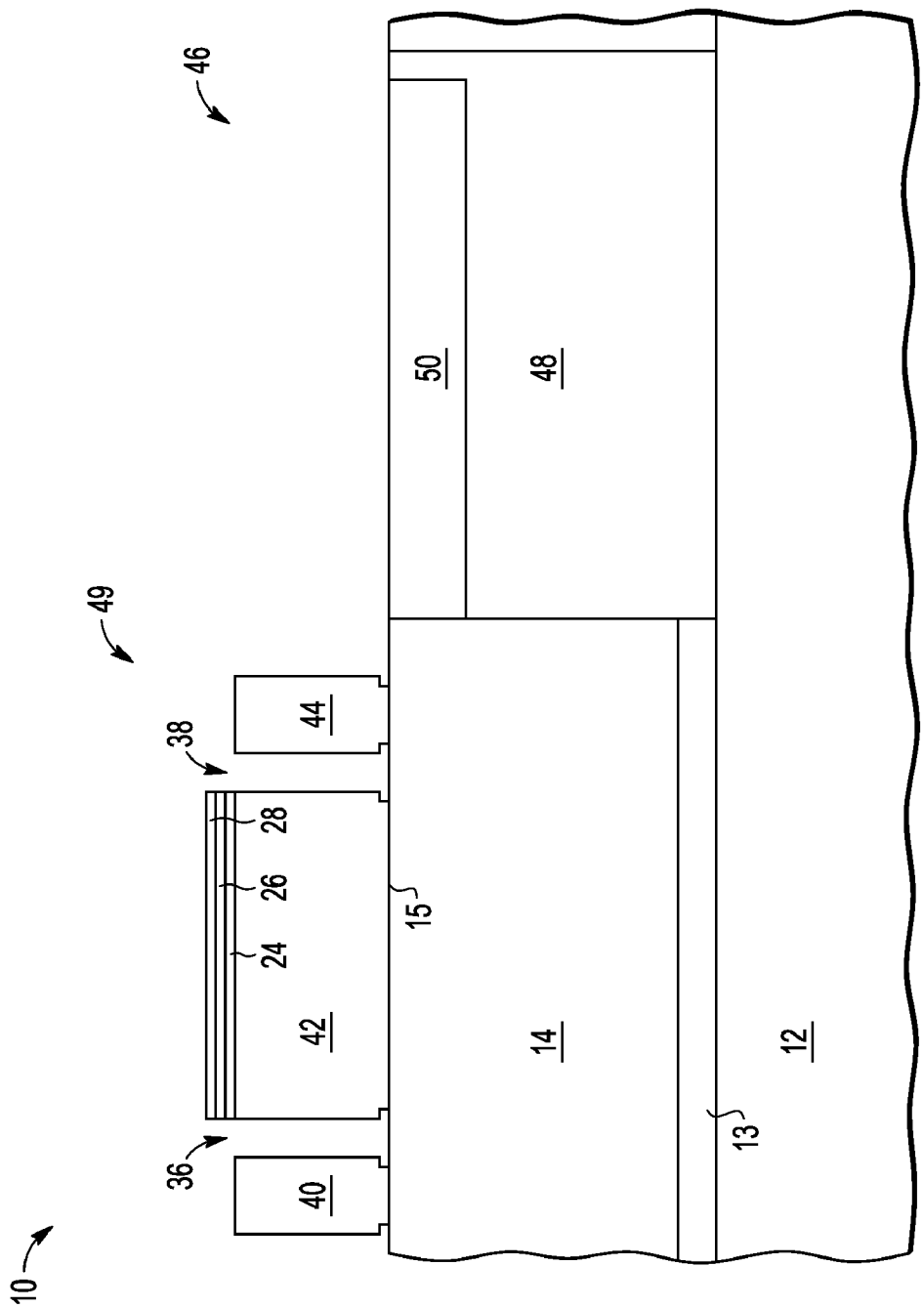
FIG. 9 is a cross section of the portion of the MEMS device of FIG. 8 and an additional portion of the MEMS device at a subsequent stage in processing.

Shown in FIG. 9 is contact region 10 in addition to a capacitor region 46 that is adjacent to interconnect region 14. Capacitor region 76 comprises a cavity 48 over substrate 12 and a movable member 50, which may be polysilicon, connected to interconnect region 14. In this example, movable member 50 is held in place by interconnect region 14 and is movable up and down in the vertical direction as viewed in FIG. 9. Contact region 10 and capacitor region 46 together may be considered a MEMS 49. In a typical MEMS device there will be many more contact regions and capacitor regions. Also the proximity of contact and interconnect regions are unlikely to be as close as that suggested by FIG. 9. The particular way a movable member is arranged relative to other features is widely variable, but a movable member is will typically be in a cavity so that is movable but is also supported in some form.

Figure 10:
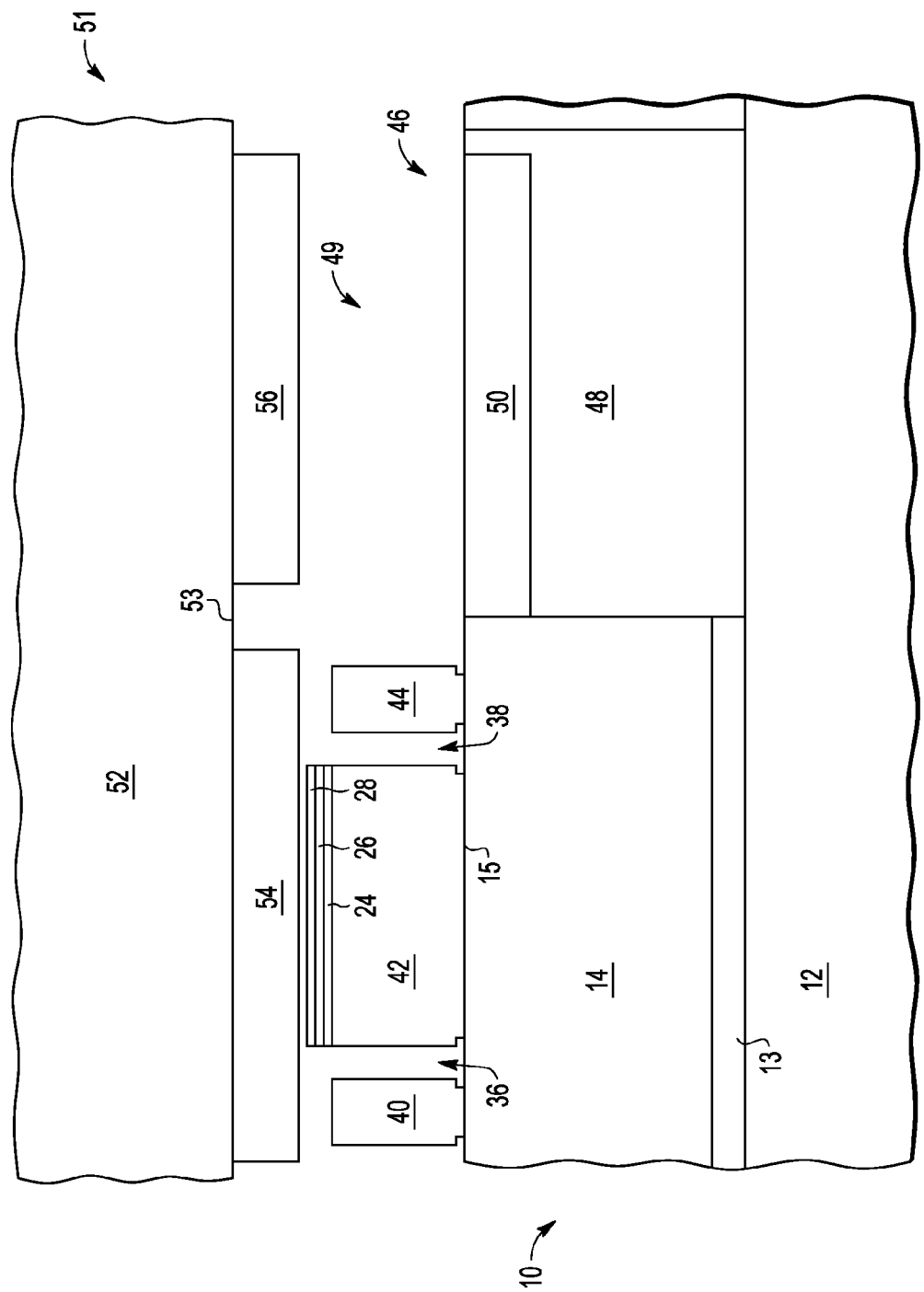
FIG. 10 is a cross section of the portion of the MEMS device of FIG. 9 and the additional portion of the MEMS device at a subsequent stage in processing.

Shown in FIG. 10 is MEMS 49 and a capping wafer 51 immediately prior to be attached to each other. Capping wafer 51 comprises a functional region 52 having a bottom surface 53, a contact region 54 on bottom surface 53, and a capacitor plate 56 on bottom surface 53. Contact region 54 and capacitor plate 56 are preferably aluminum about 2 microns thick. Contact region 54 is aligned to be centered around conductive portion 42 and extending over conductive portions 40 and 44, and capacitor plate 56 is aligned to movable member 50.

Figure 11:
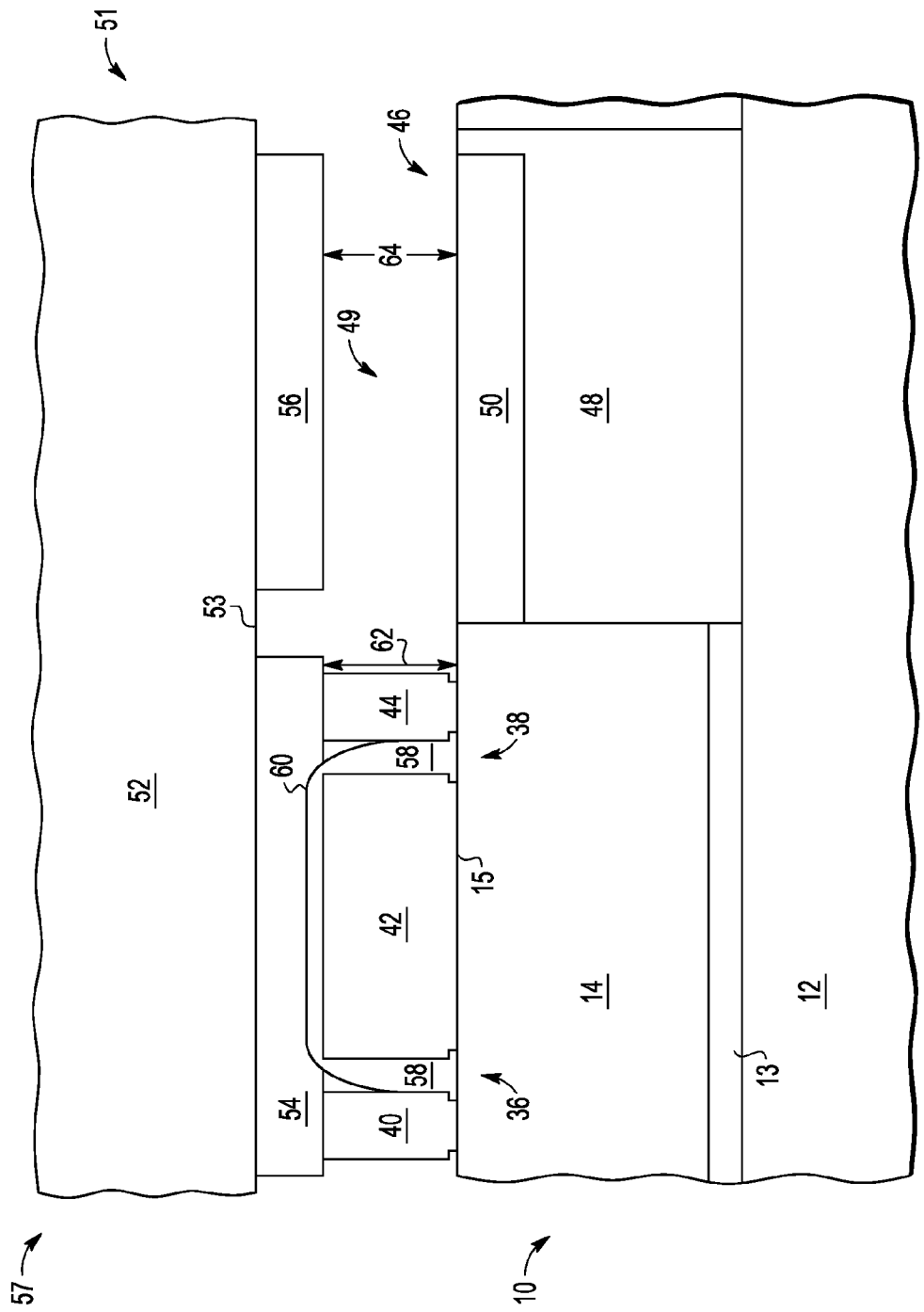
FIG. 11 is a cross section of the portion of the MEMS device of FIG. 10 and the additional portion of the MEMS device at a subsequent stage in processing.

Shown in FIG. 11 is a device 57 formed by connected MEMS 49 to capping wafer 51 using heat and pressure to form a eutectic bond 60 between contact region 54 and conductive portion 42 using a bonding material 58 resulting from SiGe layer 26, germanium layer 28 and a portion of contact region 54. The eutectic process results in bonding material 58 partially filling openings 36 and 38. The process distorts contact region 54. The process has minimal effect on the outer portions of contact region 54 that press down on conductive portions 40 and 44 of polysilicon. With the minimal effect at the contact between conductive portions 40 and 44 and contact region 54, a predictable distance between plane 15 and bottom surface 53 is established based on the height of conductive portions 40 and 44 which in turn is based on the deposited height of layer 22. The process also has minimal effect on conductive portion 42 also of polysilicon but the eutectic process alters contact region 54. This distortion would be difficult to predict precisely and this distortion would effect the distance between bottom surface 53 and top plane 15 in the absence of conductive portions 40 and 44. In this case of contact region 54 and capacitor plate 56 having the same thickness and the top surface of movable member be aligned with top plane 15, a height 62 of conductive portion 44 is the same as a distance 64 between movable member 50 and capacitor plate 56. This establishes an at rest capacitance between capacitor plate 56 and movable member 50. Movable member 50, when moving, will change its distance, and thus capacitance, from capacitor plate 56 and such change will be from distance 64, which is highly controllable as being set by a deposition of polysilicon. In this example the at rest distance, distance 64, is the same as height 64, but they could be different with benefits remaining the same. For example, the top surface of movable member could be a known variation from top plane 15. Similarly, the thickness of capacitor plate 56 could vary from the thickness of contact region 54 by a known amount with result of having the same predictability of distance 64.

Another benefit is that conductive portions 40 and 44 provide a seal around eutectic bond 60. Bond material 58 is contained within the distortion of contact region 60, conductive portions 40, 42, and 44, and the top surface of interconnect region 14.

By now it should be appreciated that there has been provided a method of forming a micro-electromechanical system (MEMS). The method includes providing a cap substrate. The method further includes providing a support substrate. The method further includes depositing a conductive material over the support substrate. The method further includes patterning the conductive material to leave a conductive portion that forms a gap stop and a contact, wherein the gap stop is separated form the contact by an opening. The method further includes forming a bonding material over the contact and in the opening, wherein the gap stop and the contact prevent the bonding material from extending outside the opening. The method further includes attaching the cap substrate to the support substrate by the step of forming the bonding material. The method may have a further characterization by which forming the bonding material comprises forming a semiconductor layer over the conductive material and heating the cap substrate and the semiconductor layer to form the bonding material and bond the cap substrate to the support substrate. The method may forming a stack over the conductive portion wherein the step of forming the semiconductor layer is part of the step of forming the stack. The method may have a further characterization by which the step of forming the stack over the conductive portion further comprises forming a seed layer comprising silicon over the conductive portion and forming a first layer comprising silicon and germanium over the seed layer, and the step of forming the semiconductor layer, further comprises forming a second layer comprising germanium over the first layer. The method may further comprise patterning the stack before the step of patterning the conductive material. The method may further comprise forming an oxide over the conductive material, patterning the oxide before the step of forming the stack over the conductive material, and removing the oxide after the step of patterning the conductive material. The method may have a further characterization by which providing the cap substrate further comprises providing a cap substrate having an aluminum layer formed in contact with one surface of the cap substrate and wherein after the step of forming the bonding material, the aluminum layer is in contact with the bonding material. The method may have a further characterization by which the bonding material comprises a eutectic material comprising aluminum and germanium. The method may have a further characterization by which the step of depositing the conductive material further comprises depositing doped polysilicon. The method may have a further characterization by which the step of attaching the cap substrate to the support substrate further comprises forming a capacitor in an area of the cap substrate and the support substrate.

Also described is a method of forming a micro-electromechanical system (MEMS). The method includes providing a first structure, wherein the first structure comprises a cap wafer and a first conductive material formed on an edge of the cap wafer. The method further includes providing a second structure, wherein the step of providing the second structure comprises providing a support wafer, depositing a second conductive material over the support wafer, patterning the second conductive material to form an opening in the second conductive material, a gap stop, and a contact, wherein the opening is between the gap stop and the contact, and forming a semiconductor stack over the contact. The method further includes bonding the first structure to the second structure by heating the semiconductor layer so it flows into the opening and the gap stop and the contact stop the semiconductor layer from flowing outside of the opening. The method may have a further characterization by which the step of heating the semiconductor layer comprises heating the semiconductor stack to form a eutectic bonding material. The method may have a further characterization by which the step of forming the semiconductor stack comprises forming a seed layer comprising silicon over the second conductive material, forming a first semiconductor layer over the seed layer, wherein the first semiconductor layer comprises silicon and germanium, and forming a second semiconductor layer over the first semiconductor layer, wherein the second semiconductor layer comprises germanium, and the step of heating the semiconductor stack to form the eutectic bonding material comprises forming an aluminum and germanium comprising eutectic bonding material. The method may further comprise patterning the stack before the step of patterning the second conductive material. The method may further comprise forming an oxide over the second conductive material, patterning the oxide before the step of forming the semiconductor stack and removing the oxide after the step of patterning the second conductive material. The method may have a further characterization by which the step of depositing the second conductive material further comprises depositing doped polysilicon. The method may have a further characterization by which after the step of bonding the first structure to the second structure, the first structure and the second conductive material are separated from each other by a dimension that is approximately equal to a height of the gap stop.

Described also is a micro-electromechanical system (MEMS). The MEMS includes a support substrate. The MEMS further includes a contact formed over the support substrate at a predetermined level. The MEMS further includes a gap stop formed adjacent to and at the predetermined level. The MEMS further includes a bonding material formed over the contact and between the contact and the gap stop, wherein the contact and the gap stop prevent the bonding material from extending beyond the gap stop and the contact in the predetermined level. The MEMS further includes a metal layer in contact with the bonding material. The MEMS further includes a cap substrate over the metal layer. The MEMS may have a further characterization by which the bonding material comprises a eutectic material comprising aluminum and germanium. The MEMS may have a further characterization by which the contact and the gap stop comprise polysilicon.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Although the invention is described herein with reference to specific embodiments, various modifications and changes can be made without departing from the scope of the present invention as set forth in the claims below. For example, other bonding materials may be used and other dimensions may be used. Also there is particular benefit in eutectic bonding, there may be benefit in using the described approach in a context other than eutectic bonding. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method of forming a micro-electromechanical system (MEMS) comprising:
   providing a cap substrate;
   providing a support substrate;
   depositing a conductive material over the support substrate;
   patterning the conductive material to leave a conductive portion that forms a gap stop and a contact, wherein the gap stop is separated form the contact by an opening;
   forming a bonding material over the contact and in the opening, wherein the gap stop and the contact prevent the bonding material from extending outside the opening; and
   attaching the cap substrate to the support substrate by the step of forming the bonding material;
   wherein forming the bonding material comprises:
      forming a semiconductor layer over the conductive material; and
      heating the cap substrate and the semiconductor layer to form the bonding material and bond the cap substrate to the support substrate; and
   further comprising forming a stack over the conductive material wherein the step of forming the semiconductor layer is part of the step of forming the stack;
   wherein the step of forming the stack over the conductive portion further comprises:
      forming a seed layer comprising silicon over the conductive portion; and
      forming a first layer comprising silicon and germanium over the seed layer; and
   wherein the step of forming the semiconductor layer further comprises forming a second layer comprising germanium over the first layer.

2. The method of claim 1, further comprising:
   patterning the stack before the step of patterning the conductive material.

3. The method of claim 2, further comprising:
   forming an oxide prior to forming the conductive material;
   patterning the oxide before the step of forming the stack over the conductive material; and
   removing the oxide after the step of patterning the conductive material.

4. The method of claim 2, wherein providing the cap substrate further comprises providing a cap substrate having an aluminum layer formed in contact with one surface of the cap substrate and wherein after the step of forming the bonding material, the aluminum layer is in contact with the bonding material.

5. The method of claim 4, wherein the bonding material comprises a eutectic material comprising aluminum and germanium.

6. The method of claim 1, wherein the step of depositing the conductive material further comprises depositing doped polysilicon.

7. The method of claim 1, wherein the step of attaching the cap substrate to the support substrate further comprises forming a capacitor in an area of the cap substrate and the support substrate.

8. A method of forming a micro-electromechanical system (MEMS) comprising
   providing a first structure, wherein the first structure comprises a cap wafer and a first conductive material formed on an edge of the cap wafer;
   providing a second structure, wherein the step of providing the second structure comprises:
      providing a support wafer;
      depositing a second conductive material over the support wafer;
      patterning the second conductive material to form an opening in the second conductive material, a gap stop, and a contact, wherein the opening is between the gap stop and the contact; and
      forming a semiconductor stack over the contact; and
   bonding the first structure to the second structure by heating the semiconductor layer so it flows into the opening and the gap stop and the contact stop the semiconductor layer from flowing outside of the opening;
   wherein the step of heating the semiconductor layer comprises heating the semiconductor stack to form a eutectic bonding material; and
   wherein the step of forming the semiconductor stack comprises:
      forming a seed layer comprising silicon over the second conductive material;
      forming a first semiconductor layer over the seed layer, wherein the first semiconductor layer comprises silicon and germanium; and
      forming a second semiconductor layer over the first semiconductor layer, wherein the second semiconductor layer comprises germanium; and
   wherein the step of heating the semiconductor stack to form the eutectic bonding material comprises forming an aluminum and germanium comprising eutectic bonding material.

9. The method of claim 8, further comprising patterning the stack before the step of patterning the second conductive material.

10. The method of claim 9, further comprising:
    forming an oxide prior to forming the second conductive material;
    patterning the oxide before the step of forming the semiconductor stack; and
    removing the oxide after the step of patterning the second conductive material.

11. The method of claim 8, wherein the step of depositing the second conductive material further comprises depositing doped polysilicon.

12. The method of claim 8, wherein after the step of bonding the first structure to the second structure, the first structure and the second conductive material are separated from each other by a dimension that is approximately equal to a height of the gap stop.

* * * * *